(12) United States Patent
Doi et al.

(10) Patent No.: US 7,357,990 B2
(45) Date of Patent: Apr. 15, 2008

(54) POLYMERIC FLUORESCENT MATERIAL, PROCESS FOR PRODUCING THE SAME, AND POLYMERIC LUMINISCENT ELEMENT

(75) Inventors: Shuji Doi, Tsukuba (JP); Takanobu Noguchi, Tsukuba (JP); Yoshiaki Tsubata, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 10/480,996

(22) PCT Filed: Jun. 19, 2001

(86) PCT No.: PCT/JP01/05219

§ 371 (c)(1),
(2), (4) Date: May 20, 2004

(87) PCT Pub. No.: WO02/102925

PCT Pub. Date: Dec. 27, 2002

(65) Prior Publication Data

US 2004/0234810 A1    Nov. 25, 2004

(51) Int. Cl.
*H01J 1/62* (2006.01)
*C08F 290/14* (2006.01)

(52) U.S. Cl. ............ 428/690; 428/917; 313/504; 313/506; 525/50

(58) Field of Classification Search ......... 428/690, 428/917; 313/506, 504; 257/E51.028; 525/50
See application file for complete search history.

(56) References Cited

U.S. PATENT DOCUMENTS 5,589,320 A * 12/1996 Ohnishi et al. ............. 430/321
6,696,180 B2 * 2/2004 Doi et al. ................... 428/690

FOREIGN PATENT DOCUMENTS

EP    443861 A2    2/1991

| | | |
|---|---|---|
| EP | 0 443 861 A2 | 8/1991 |
| JP | 62-273848 A | 11/1987 |
| JP | 02-242816 A | 9/1990 |
| JP | 2-242816 A | 9/1990 |
| JP | 03-244630 A | 10/1991 |
| JP | 06-279572 A | 10/1994 |
| JP | 6-279572 A | 10/1994 |
| JP | 2001-76880 A | 3/2001 |
| WO | WO 90/13148 A1 | 11/1990 |

OTHER PUBLICATIONS

D. Braun et al., "Visible light emission from semiconducting polymer diodes", *Appl. Phys. Lett.*, vol. 58, No. 18, May 6, 1991, pp. 1982-1984.

Y. Ohmori et al., "Blue Electroluminescent Diodes Utilizing Poly(alkylfluorene)", *Japanese Journal of Applied Physics*, vol. 30, No. 11B, Nov. 1991, pp. L1941-L1943.

G. Grem et al., Realization of a Blue-Light-Emitting Device using Poly(p-phenylene), *Advanced Materials*, vol. 4, No. 1, Jan. 1992, pp. 36-37.

* cited by examiner

*Primary Examiner*—Callie Shosho
*Assistant Examiner*—Camie S Thompson
(74) *Attorney, Agent, or Firm*—Sughrue Mion, PLLC

(57) ABSTRACT

A method for producing a polymeric fluorescent substance characterized by comprising the step of contacting with an alkali a crude polymeric fluorescent substance that is fluorescent in a solid state and has a polystyrene equivalent number average molecular weight of $10^4$ to $10^8$ and one or more repeating units represented by the following formula (1):

$$-Ar_1-(CR_1=CR_2)_n- \quad (1)$$

wherein $Ar_1$ is an arylene group or heterocyclic compound group that is unsubstituted or substituted by one or more substituents; $R_1$ and $R_2$ each independently represent a group selected from the group consisting of a hydrogen atom, an alkyl group, an aryl group, a heterocyclic compound group and a cyano group, in which the aryl group and the heterocyclic compound group is optionally substituted by another substituent; and n is 0 or 1.

17 Claims, No Drawings

POLYMERIC FLUORESCENT MATERIAL, PROCESS FOR PRODUCING THE SAME, AND POLYMERIC LUMINISCENT ELEMENT

TECHNICAL FIELD

The present invention relates to a method for producing a polymeric fluorescent substance and a polymer light emitting device using the same (sometimes referred to as "polymer LED" hereinafter).

BACKGROUND ART

Various high molecular weight light emitting materials (polymeric fluorescent substances) have been studied, because they are soluble in a solvent and thus able to form a light emitting layer by an application method unlike lower molecular weight ones. For example, the followings are disclosed: poly(p-phenylene vinylene) (sometimes referred to as "PPV" hereinafter) (WO9013148, JP-A-3-244630, Appl. Phys. Lett., vol. 58, page 1982 (1991) or the like), polyfluorene (Jpn. J. Appl. Phys. vol. 30, page L1941 (1991), a polypara-phenylene derivative (Adv. Mater., vol. 4, page 36 (1992)), and the like.

In order to utilize a feature of a polymeric fluorescent substance, that is, the feature with which they are soluble in a solvent and thus able to form a light emitting layer by an application method, a polymeric fluorescent substance further excellent in solubility has been required.

DISCLOSURE OF THE INVENTION

An object of the present invention is to provide a polymeric fluorescent substance excellent in solubility, a production method therefor, and a high performance polymer LED capable of being driven at low voltage and high efficiency by use of the polymeric fluorescent substance.

The present inventors studied strenuously to solve the above problems and have found that the solubility of a polymeric fluorescent substance in an organic solvent is improved by contacting a particular polymeric fluorescent substance with an alkali and that a high performance polymer LED capable of being driven at low voltage and high efficiency can be obtained by use of the polymeric fluorescent substance. Thus, the present inventors have completed the present invention.

That is, the present invention relates to 1) a method for producing a polymeric fluorescent substance comprising the step of contacting with an alkali a crude polymeric fluorescent substance that is fluorescent in a solid state and has a polystyrene equivalent number average molecular weight of $10^4$ to $10^8$ and one or more repeating units represented by the following formula (1):

$$-Ar_1-(CR_1=CR_2)_n- \quad (1)$$

wherein $Ar_1$ is an arylene group or heterocyclic compound group that is unsubstituted or substituted by one or more substituents; $R_1$ and $R_2$ each independently represent a group selected from the group consisting of a hydrogen atom, an alkyl group an aryl group, a heterocyclic compound group and a cyano group, in which the aryl group and the heterocyclic compound group is optionally substituted by another substituent; and n is 0 or 1.

Further, the present invention relates to 2) a polymeric fluorescent substance obtainable by the production method described in the above 1).

Furthermore, the present invention relates to 3) a polymer light emitting device having at least a light emitting layer between electrodes consisting of a pair of an anode and a cathode at least one of which is transparent or translucent, the light emitting layer containing the polymeric fluorescent substance described in the above 2).

Moreover, the present invention relates to 4) a sheet-shaped light source using the polymer light emitting device described in the above 3). Then, the present invention relates to 5) a segment display device using the polymeric light emitting device described in the above 3). Next, the present invention relates to 6) a dot matrix display device using the polymer light emitting device described in the above 3). Further, the present invention relates to 7) a liquid crystal display device using the polymer light emitting device described in the above 3) as a backlight.

BEST MODE FOR CARRYING OUT THE INVENTION

A method for producing a polymeric fluorescent substance of the present invention and a polymer LED using the same will be described in detail below.

The method for producing the polymeric fluorescent substance of the present invention is characterized by comprising the step of contacting with an alkali a crude polymeric fluorescent substance that is fluorescent in a solid state and has a polystyrene equivalent number average molecular weight of $10^4$ to $10^8$ and one or more repeating units represented by the following formula (1):

$$-Ar_1-(CR_1=CR_2)_n- \quad (1)$$

An organic solvent usable in the production method of the present invention is not particularly limited as long as it can dissolve the crude polymeric fluorescent substance, but it is preferably a good solvent for the crude polymeric fluorescent substance because it is preferable for the crude polymeric fluorescent substance to be sufficiently dissolved in order to be treated with the alkali uniformly.

Examples of the good solvent for the crude polymeric fluorescent substance include chloroform, methylene chloride, dichloroethane, tetrahydrofuran, toluene, xylene, mesitylene, tetralin, decalin, n-butylbenzene, and dioxane. Typically, 0.1 wt % or more of crude polymeric fluorescent substances can be dissolved in these solvents, but it depends on the structure or molecular weight of the crude polymeric fluorescent substance.

The alkali to be used in the production method of the present invention preferably has a pKa value of 10 or more.

Examples of the alkali include a metal alkoxide, a metal hydroxide, a metal amide compound, a metal hydride compound, ammonia, and an amine.

Examples of the metal alkoxide include $LiOCH_3$, $NaOCH_3$, $KOCH_3$, $LiOC_2H_5$, $NaOC_2H_5$, $KOC_2H_5$, $LiO(t-C_4H_9)$, $NaO(t-C_4H_9)$ and $KO(t-C_4H_9)$. Examples of the metal hydroxide include LiOH, NaOH and KOH. Examples of the metal amide compound include $LiNH_2$, $NaNH_2$, $KNH_2$, $LiN(i-C_3H_7)_2$, $NaN(i-C_3H_7)_2$ and $KN(i-C_3H_7)_2$. Examples of the metal hydride compound include LiH, NaH and KH. Examples of the amine include triethylamine, pyridine, 4-dimethylaminopyridine and diazabicycloundecane.

Among the above, $LiO(t-C_4H_9)$, $NaO(t-C_4H_9)$ $KO(t-C_4H_9)$, $LiN(i-C_3H_7)2$, $NaN(i-C_3H_7)2$, $KN(i-C_3H_7)2$, ammonia and amines are preferable with respect to the solubility to an organic solvent.

Further, ammonia and triethylamine are more preferable because they enhance the intensity of fluorescence. Ammonia is particularly preferable because it has a high volatility and is unlikely to remain after treatment.

The method for producing the polymeric fluorescent substance of the present invention comprises the step of contacting with an alkali the crude polymeric fluorescent substance. The method may have this step twice or more. In the step of contacting the crude polymeric fluorescent substance with an alkali, it is preferable to contact the crude polymeric fluorescent substance dissolved in the organic solvent with an alkali from the standpoint of contact efficiency.

Examples of the method for contacting with an alkali include (a) a method in which an alkali is just added as it is to a solution of a crude polymeric fluorescent substance; (b) a method in which a solution of an alkali in a solvent is added to a solution of a crude polymeric fluorescent substance; (c) a method in which a solution of a crude polymeric fluorescent substance is added to a solution of an alkali; and (d) a method in which a crude polymeric fluorescent substance is dispersed in a solvent in which an alkali is dissolved.

In the methods (b) and (c), the solvent in which the alkali is to be dissolved may be an organic solvent or water. When the crude polymeric fluorescent substance is dissolved in an organic solvent, the solvent in which the alkali is to be dissolved may be a solvent capable of homogeneously being mixed or a solvent uncapable of homogeneously being mixed with the organic solvent in which the crude polymeric fluorescent substance is dissolved. Among organic solvents, preferred is the same organic solvent as that in which the crude polymeric fluorescent substance is dissolved.

In the step of contacting with an alkali, the contact efficiency between the alkali and the polymeric fluorescent substance can be improved by stirring and shaking the solution or other means, as necessary.

In order to obtain a sufficient solubility-improving effect, the time for contacting with an alkali is usually not shorter than 30 minutes to not longer than 20 hours, preferably not shorter than 1 hour to not longer than 20 hours, but not particularly limited thereto. Further, the temperature for contacting with the alkali is usually not lower than 10° C. to not higher than 200° C., preferably from room temperature to a temperature lower than the boiling point of a solvent. The temperature is practically and more preferably not lower than 30° C. to not higher than 150° C., further preferably not lower than 50° C. to not higher than 100° C., depending on the solvent to be used. However, when using a highly volatile alkali such as ammonia, it is preferable to treat it around room temperature. During the treatment, in order to inhibit deterioration of the polymeric fluorescent substance, it is preferable to be sealed in an inert atmosphere and shield the solution of the polymeric fluorescent substance from light having wavelengths absorbable by the solution.

In the present invention, the step of contacting the crude polymeric fluorescent substance with an alkali may be performed continuously with the step of preparing the crude polymeric fluorescent substance without separating the two steps. For example, there is a method in which the solution of the crude polymeric fluorescent substance is made contacted with an alkali, as it is, without separating the fluorescent substance as a precipitate.

The present production method may comprise other steps such as neutralization, washing, reprecipitation, drying, as required, in addition to the step of contacting with an alkali.

After the above step of contacting with an alkali, the step for removing the alkali from the polymeric fluorescent substance is preferably provided. The alkali may be removed by sufficiently washing after neutralization treatment or by sufficiently washing using a solvent excellent in dissolving the alkali.

The alkali may be also removed by reprecipitating the polymeric fluorescent substance obtained by contacting with the alkali using a poor solvent after once dissolving in a good solvent.

A highly volatile alkali such as ammonia may be removed only by drying under a reduced pressure or only by heating in an inert atmosphere.

Drying only has to be carried out under conditions to sufficiently remove the remaining solvent. In order to prevent the polymeric fluorescent substance from deterioration, it is preferable to shield it from light and dry it in an inert atmosphere. Further, it is preferable to dry the polymeric fluorescent substance at a temperature that does not thermally deteriorate it.

The polymeric fluorescent substance of the present invention typically has a polystyrene equivalent number average molecular weight of $10^4$ to $10^8$, and the total number of the repeating structures varies depending on the repeating structures and the proportion thereof as well as the treatment method after polymerization. With respect to a film forming property, the total number of the repeating structures is generally preferably 20 to 10,000, more preferably 30 to 10,000, particularly preferably 50 to 5,000.

When using the polymeric fluorescent substance of the present invention as a light emitting material for the polymer LED, the purity influences the light emitting property. Hence, it is preferable to perform a purification treatment such as reprecipitation/purification or fractionation by chromatography after polymerization or alkali treatment.

Next, the crude polymeric fluorescent substance will be described below.

The crude polymeric fluorescent substance is fluorescent in a solid state and has a polystyrene equivalent number average molecular weight of $10^4$ to $10^8$ and one or more repeating units represented by the above formula (1), and the total of the repeating units accounts for usually not less than 10 mol % to not more than 100 mol % based on all repeating units. In order to obtain a sufficient effect from the contact with an alkali, it is more preferably not less than 30 mol % to not more than 100 mol % and further preferably not less than 50 mol % to not more than 100 mol %.

In the above formula (1), $Ar_1$ is an arylene group or a heterocyclic compound group. The number of carbon atoms in the main chain portion of the arylene group is usually not less than 6 to not more than 60, and the number of carbon atoms in the main chain portion of the heterocyclic compound group is usually not less than 4 to not more than 60. "The number of carbon atoms in the main chain portion" means that even when $Ar_1$ has a substituent, the number of carbon atoms of $Ar_1$ does not include the number of the carbon atoms of the substituent.

$Ar_1$ may be selected not to damage the fluorescent property of the polymeric fluorescent substance. The specific examples include the following divalent groups:

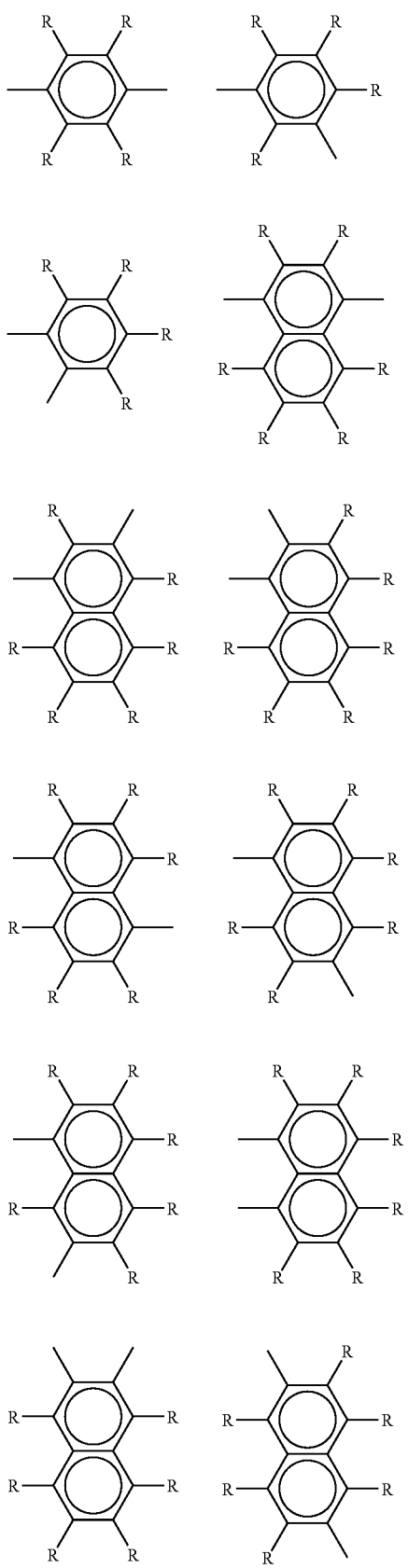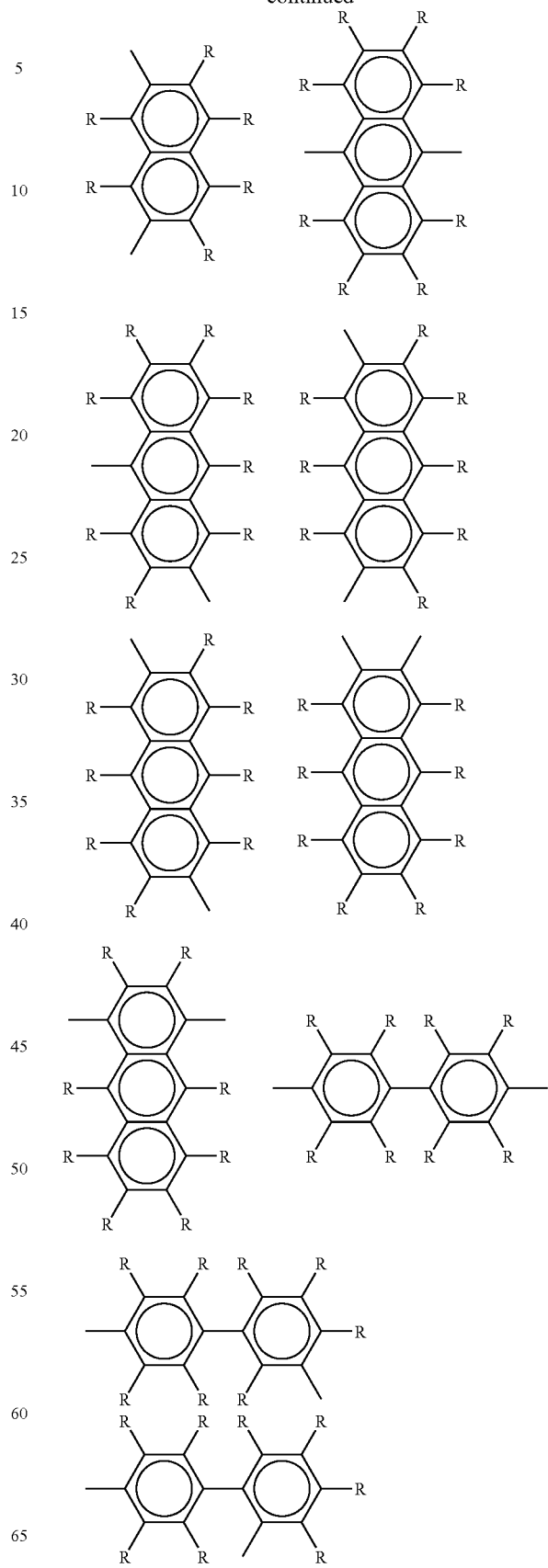

-continued
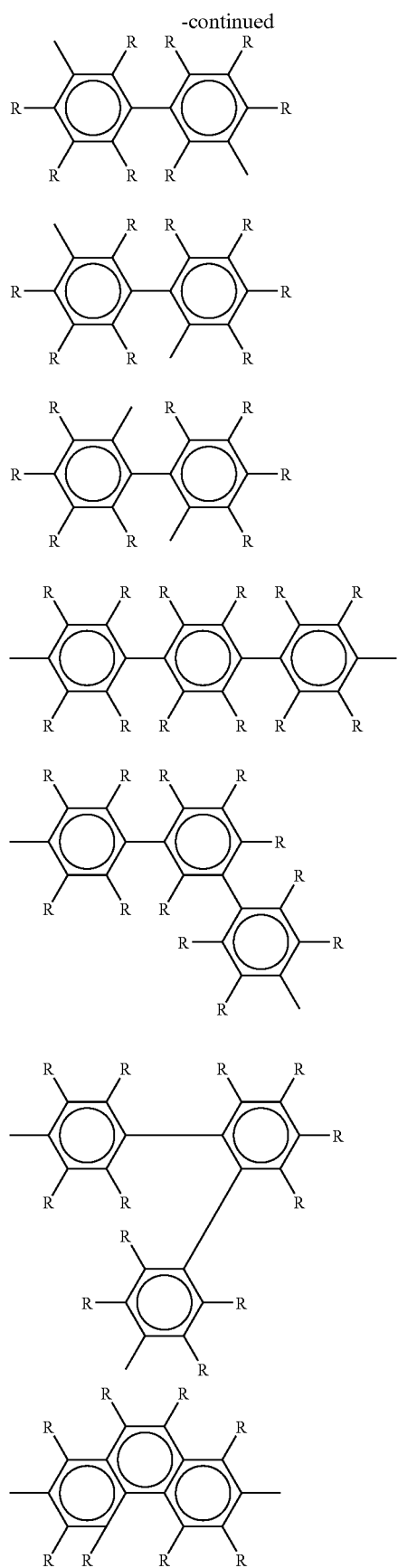
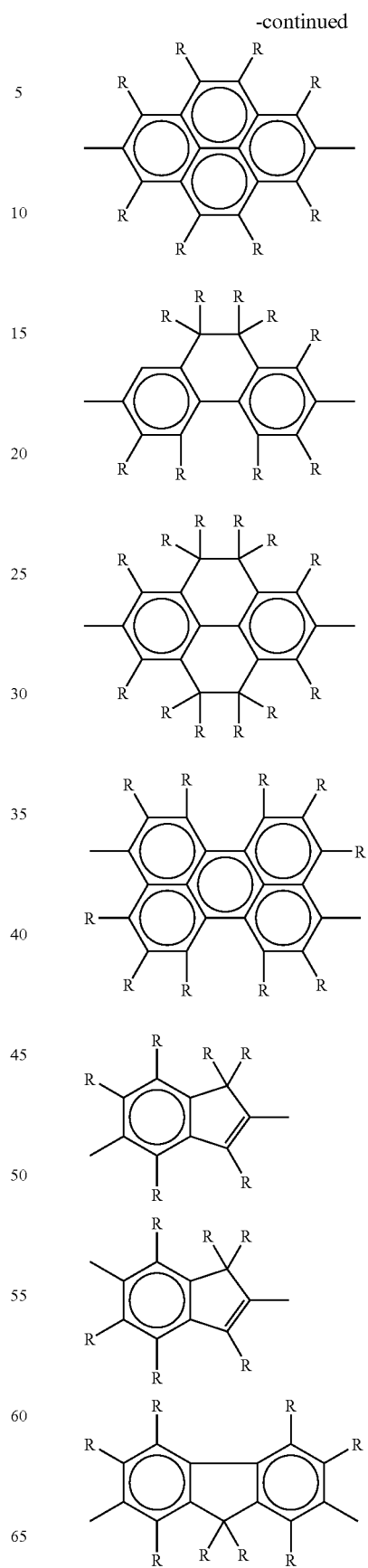

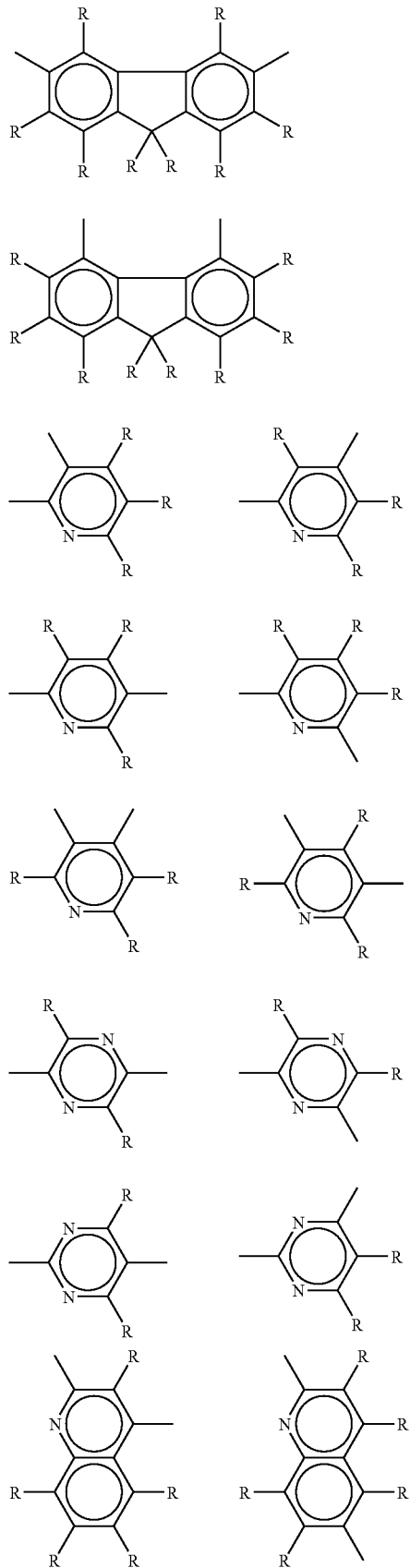

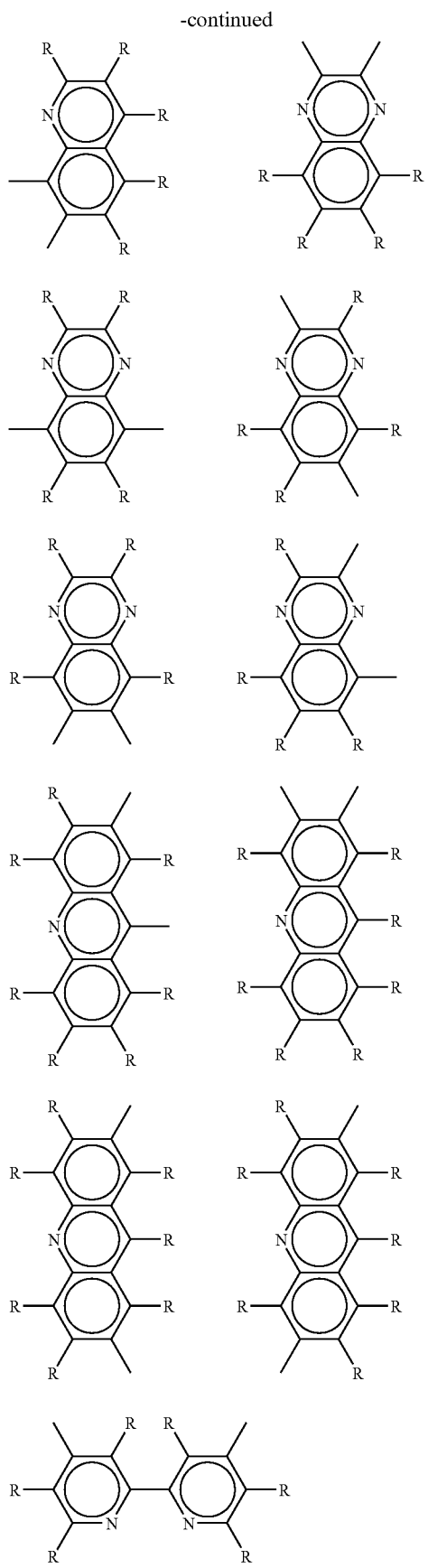
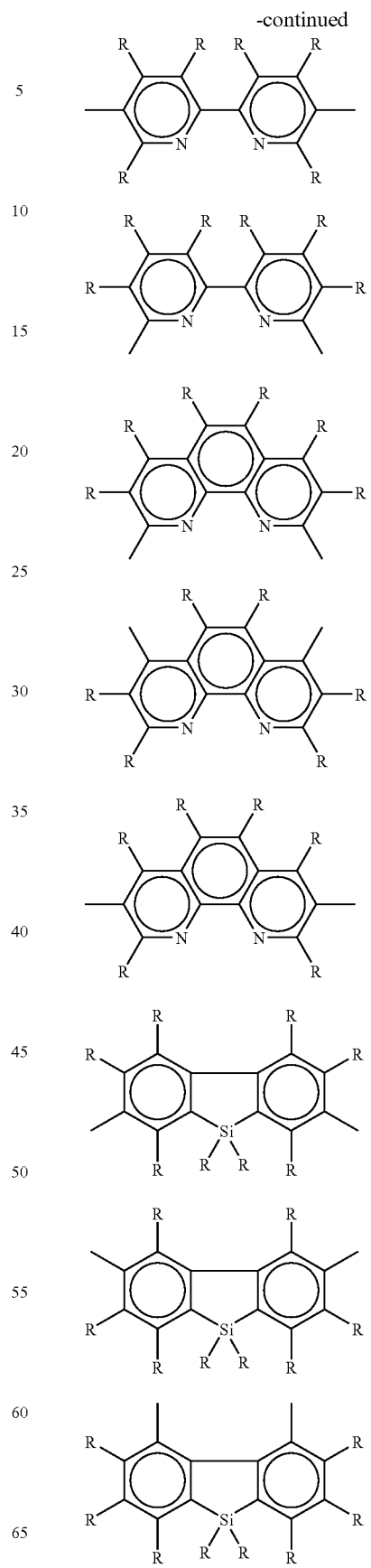

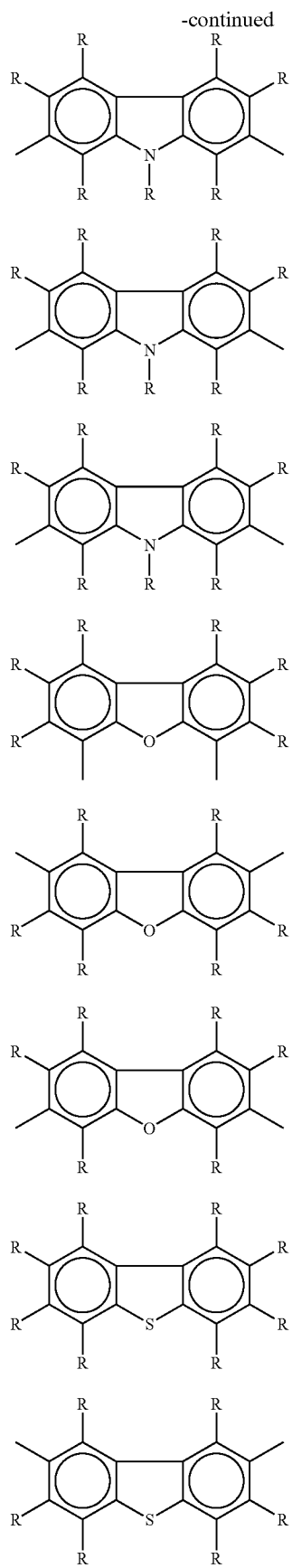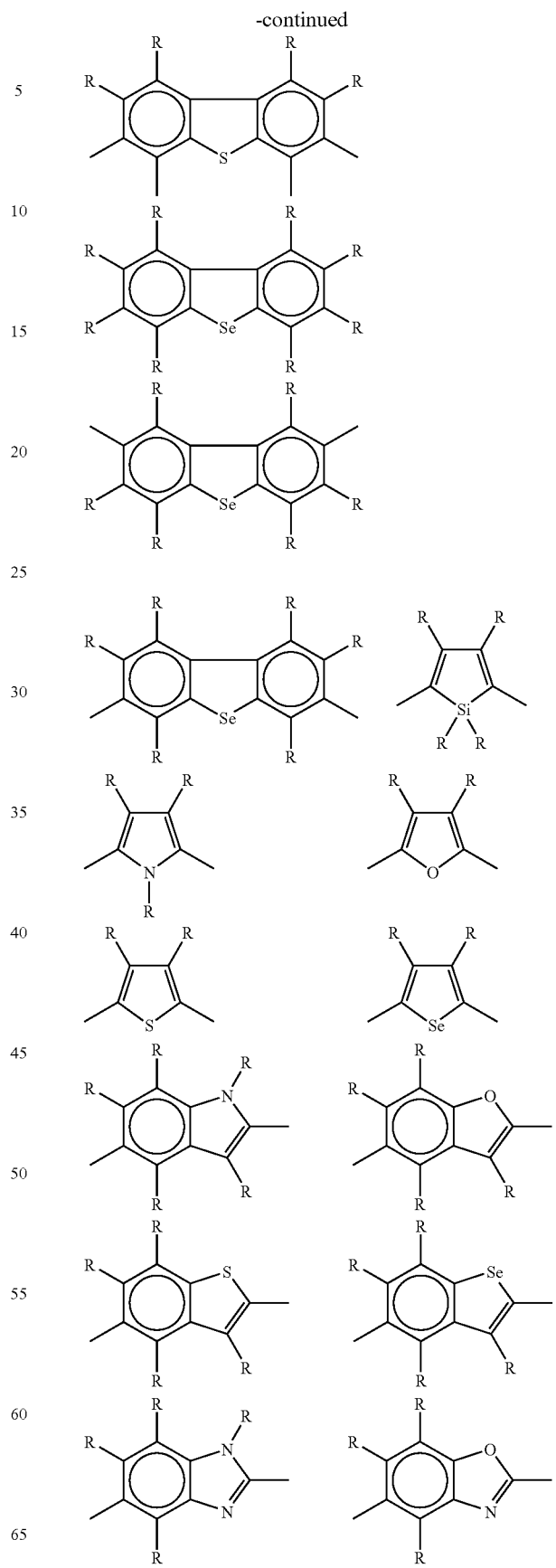

-continued

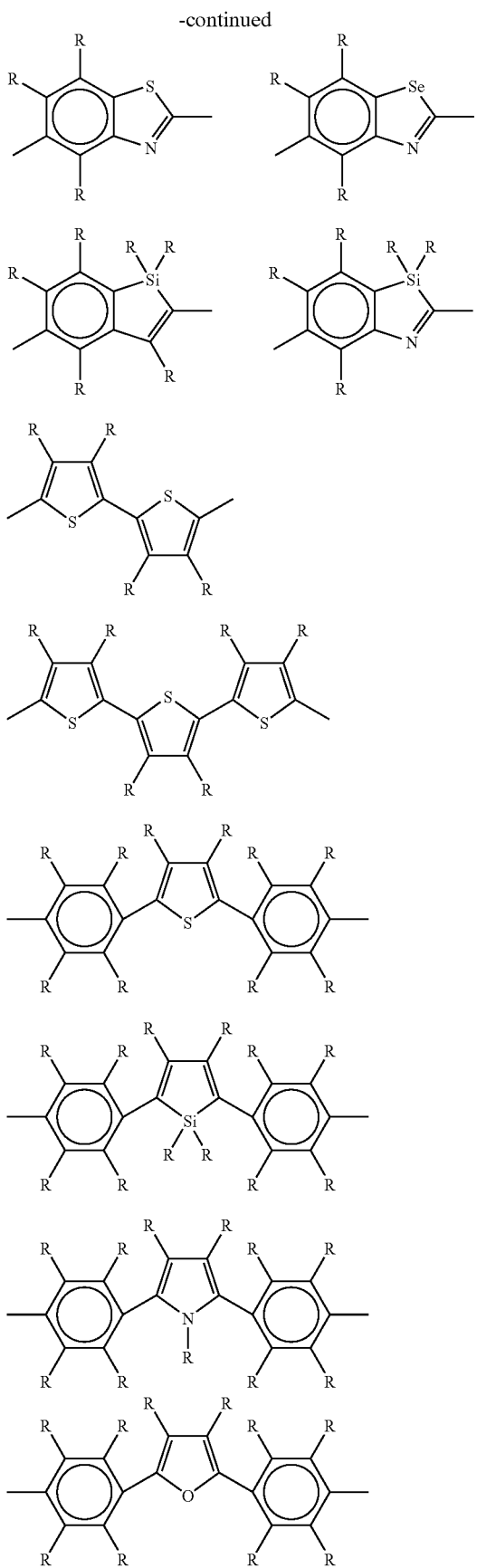

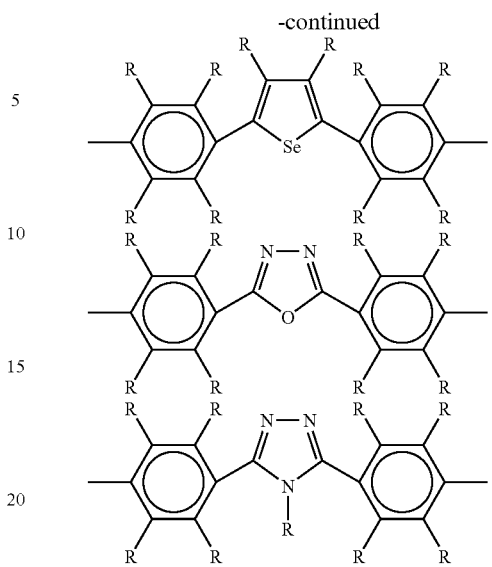

wherein R each independently represents a group selected from the group consisting of a hydrogen atom, an alkyl group, an alkoxy group, an alkylthio group, an alkylsilyl group, an alkylamino group, an aryl group, an aryloxy group, an arylalkyl group, an arylalkoxy group, an arylalkenyl group, an arylalkynyl group, an arylamino group, a heterocyclic compound group and a cyano group. In the above examples, one structural formula has a plurality of Rs that may be the same as or different from each other and that are each independently selected. When $Ar_1$ has a plurality of substituents, they may be the same as or different from each other. In order to increase the solubility to a solvent, it is preferable to have at least one or more substituents other than a hydrogen atom and have repeating units including substituents which are less symmetric in the shapes.

The case where R is a hydrogen atom or a substituent other than a cyano group will be described below.

The alkyl group may be straight, branched or cyclic, and usually has about 1 to 20 carbon atoms. The specific examples include a methyl group, an ethyl group, a propyl group, an i-propyl group, a butyl group, an i-butyl group, a t-butyl group, a pentyl group, a hexyl group, a cyclohexyl group, a heptyl group, an octyl group, a 2-ethylhexyl group, a nonyl group, a decyl group, a 3,7-dimethyloctyl group and a lauryl group. A pentyl group, a hexyl group, an octyl group, a 2-ethylhexyl group, a decyl group, and a 3,7-dimethyloctyl group are preferred.

The alkoxy group may be straight, branched or cyclic, and usually has about 1 to 20 carbon atoms. The specific examples include a methoxy group, an ethoxy group, a propyloxy group, an i-propyloxy group, a butoxy group, an i-butoxy group, a t-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, and a lauryloxy group. A pentyloxy group, a hexyloxy group, an octyloxy group, a 2-ethylhexyloxy group, a decyloxy group, and a 3,7-dimethyloctyloxy group are preferred.

The alkylthio group may be straight, branched or cyclic, and usually has about 1 to 20 carbon atoms. The specific examples include a methylthio group, an ethylthio group, a propylthio group, an i-propylthio group, a butylthio group, an i-butylthio group, a t-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, and a laurylthio group. A pentylthio group, a hexylthio group, an octylthio group, 2-ethylhexylthio group, a decylthio group, and a 3,7-dimethyloctylthio group are preferred.

The alkylsilyl group may be straight, branched or cyclic, and usually has about 1 to 60 carbon atoms. The specific examples include a methylsilyl group, an ethylsilyl group, a propylsilyl group, an i-propylsilyl group, a butylsilyl group, an i-butylsilyl group, a t-butylsilyl group, a pentylsilyl group, a hexylsilyl group, a cyclohexylsilyl group, a heptylsilyl group, an octylsilyl group, a 2-ethylhexylsilyl group, a nonylsilyl group, a decylsilyl group, a 3,7-dimethyloctylsilyl group, a laurylsilyl group, a trimethylsilyl group, an ethyldimethylsilyl group, a propyldimethylsilyl group, an i-propyldimethylsilyl group, a butyldimethylsilyl group, a t-butyldimethylsilyl group, a pentyldimethylsilyl group, a hexyldimethylsilyl group, a heptyldimethylsilyl group, an octyldimethylsilyl group, a 2-ethylhexyl-dimethylsilyl group, a nonyldimethylsilyl group, a decyldimethylsilyl group, a 3,7-dimethyloctyl-dimethylsilyl group, and a lauryldimethylsilyl group. A pentylsilyl group, a hexylsilyl group, an octylsilyl group, a 2-ethylhexylsilyl group, a decylsilyl group, a 3,7-dimethyloctylsilyl group, a pentyldimethylsilyl group, a hexyldimethylsilyl group, an octyldimethylsilyl group, a 2-ethylhexyl-dimethylsilyl group, a decyldimethylsilyl group, and a 3,7-dimethyloctyl-dimethylsilyl group are preferred.

The alkylamino group may be straight, branched or cyclic, may be a monoalkylamino group or dialkylamino group, and usually has about 1 to 40 carbon atoms. The specific examples include a methylamino group, a dimethylamino group, an ethylamino group, a diethylamino group, a propylamino group, an i-propylamino group, a butylamino group, an i-butylamino group, a t-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, and a laurylamino group. A pentylamino group, a hexylamino group, an octylamino group, a 2-ethylhexylamino group, a decylamino group, and a 3,7-dimethyloctylamino group are preferred.

The aryl group usually has about 6 to 60 carbon atoms. The specific examples include a phenyl group, a $C_1$-$C_{12}$ alkoxyphenyl group ($C_1$-$C_{12}$ indicates that the number of carbon atoms is 1 to 12; the same shall be applied hereinafter), a $C_1$-$C_{12}$ alkylphenyl group, a 1-naphthyl group, and a 2-naphthyl group. A $C_1$-$C_{12}$ alkoxyphenyl group and a $C_1$-$C_{12}$ alkylphenyl group are preferred.

The aryloxy group usually has about 6 to 60 carbon atoms. The specific examples include a phenoxy group, a $C_1$-$C_{12}$ alkoxyphenoxy group, a $C_1$-$C_{12}$ alkylphenoxy group, a 1-naphthyloxy group, and a 2-naphthyloxy group. A $C_1$-$C_{12}$ alkoxyphenoxy group and a $C_1$-$C_{12}$ alkylphenoxy group are preferred.

The arylalkyl group usually has about 7 to 60 carbon atoms. The specific examples include a phenyl-$C_1$-$C_{12}$ alkyl group, a $C_1$-$C_{12}$ alkoxyphenyl-$C_1$-$C_{12}$ alkyl group, a $C_1$-$C_{12}$ alkylphenyl-$C_1$-$C_{12}$ alkyl group, a 1-naphthyl-$C_1$-$C_{12}$ alkyl group, and a 2-naphthyl-$C_1$-$C_{12}$ alkyl group. A $C_1$-$C_{12}$ alkoxyphenyl-$C_1$-$C_{12}$ alkyl group and a $C_1$-$C_{12}$ alkylphenyl-$C_1$-$C_{12}$ alkyl group are preferred.

The arylalkoxy group usually has about 7 to 60 carbon atoms. The specific examples include a phenyl-$C_1$-$C_{12}$ alkoxy group, a $C_1$-$C_{12}$ alkoxyphenyl-$C_1$-$C_{12}$ alkoxy group, a $C_1$-$C_{12}$ alkylphenyl-$C_1$-$C_{12}$ alkoxy group, a 1-naphtyl-$C_1$-$C_{12}$ alkoxy group, and 2-naphthyl-$C_1$-$C_{12}$ alkoxy group. A $C_1$-$C_{12}$ alkoxyphenyl-$C_1$-$C_{12}$ alkoxy group and a $C_1$-$C_{12}$ alkylphenyl-$C_1$-$C_{12}$ alkoxy group are preferred.

The arylamino group usually has about 6 to 60 carbon atoms. The specific examples include a phenylamino group, a diphenylamino group, a $C_1$-$C_{12}$ alkoxyphenylamino group, a di($C_1$-$C_{12}$ alkoxyphenyl)amino group, a di($C_1$-$C_{12}$ alkylphenyl)amino group, a 1-naphthylamino group, and a 2-naphthylamino group. A $C_1$-$C_{12}$ alkylphenylamino group and a di ($C_1$-$C_{12}$ alkylphenyl)amino group are preferred.

The heterocyclic compound group usually has about 4 to 60 carbon atoms. The specific examples include a thienyl group, a $C_1$-$C_{12}$ alkylthienyl group, a pyrrolyl group, a furyl group, a pyridyl group, and a $C_1$-$C_{12}$ alkylpyridyl group. A thienyl group, a $C_1$-$C_{12}$ alkylthienyl group, a pyridyl group, and a $C_1$-$C_{12}$ alkylpyridyl group are preferred.

Among the examples of R, substituents containing an alkyl chain may be straight, branched, cyclic, or a combination thereof. In the case of substituents other than straight ones, the examples thereof include an isoamyl group, a 2-ethylhexyl group, a 3,7-dimethyloctyl group, a cyclohexyl group and a 4-$C_1$-$C_{12}$ alkylcyclohexyl group. In order to increase the solubility of the polymeric fluorescent substance to a solvent, one or more of the substituents of $Ar_1$ preferably contain an alkyl chain that is cyclic or branched.

Moreover, a plurality of Rs may be combined to form a ring. Further, when R is a group containing an alkyl chain, the alkyl chain may be interrupted by a group containing a heteroatom. Examples of the heteroatom include an oxygen atom, a sulfur atom, and a nitrogen atom. Examples of the group containing a heteroatom include the following groups:

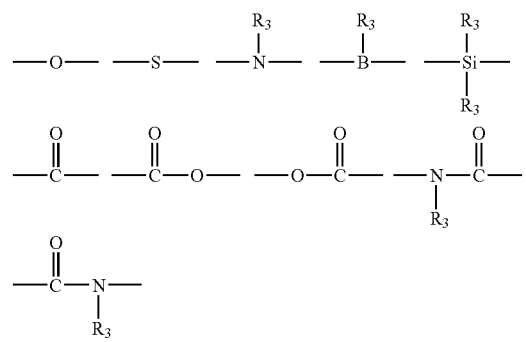

wherein examples of $R_3$ include a hydrogen atom, an alkyl group having 1 to 20 carbon atoms, an aryl group having 6 to 60 carbon atoms, and a heterocyclic compound group having 4 to 60 carbon atoms.

Further, when R contains an aryl group or a heterocyclic compound group as its partial moiety, it may have further one or more substituents.

In the above formula (1), n is 0 or 1. $R_1$ and $R_2$ in the above formula (1) each independently represent a group selected from the group consisting of a hydrogen atom, an alkyl group, an aryl group, a heterocyclic compound group and a cyano group.

The case in which $R_1$ and $R_2$ are substituents other than a hydrogen atom or a cyano group will be described below.

The alkyl group may be straight, branched or cyclic, and usually has about 1 to 20 carbon atoms. The specific examples include a methyl group, an ethyl group, a propyl group, an i-propyl group, a butyl group, an i-butyl group, a t-butyl group, a pentyl group, a hexyl group, a cyclohexyl group, a heptyl group, an octyl group, a 2-ethylhexyl group, a nonyl group, a decyl group, a 3,7-dimethyloctyl group and a lauryl group. A pentyl group, a hexyl group, an octyl group, a 2-ethylhexyl group, a decyl group and a 3,7-dimethyloctyl group are preferred.

The aryl group usually has about 6 to 60 carbon atoms. The specific examples include a phenyl group, a $C_1$-$C_{12}$ alkoxyphenyl group, a $C_1$-$C_{12}$ alkylphenyl group, a 1-naphthyl group, and a 2-naphthyl group. A $C_1$-$C_{12}$ alkoxyphenyl group and a $C_1$-$C_{12}$ alkylphenyl group are preferred.

The heterocyclic compound group usually has about 4 to 60 carbon atoms. The specific examples include a thienyl group, a $C_1$-$C_{12}$ alkylthienyl group, a pyrrolyl group, a furyl group, a pyridyl group, and a $C_1$-$C_{12}$ alkylpyridyl group. A thienyl group, a $C_1$-$C_{12}$ alkylthienyl group, a pyridyl group, and a $C_1$-$C_{12}$ alkylpyridyl group are preferred.

Moreover, a terminal group of the crude polymeric fluorescent substance may be protected by a stable group because a polymerizable group that remains as it is at the terminal group may lower the light emitting property or the life of an element or device made therefrom. Preferred ones have a conjugated structure which is continuous with the conjugated structure of the main chain. The examples thereof include a structure bonded with an aryl group or a heterocyclic compound group via a vinylene group. The specific examples include the substituent described in Formula 10 of JP-A-9-45478.

Moreover, the polymeric fluorescent substance obtained by the production method of the present invention also has substantially the same repeating unit as the crude polymeric fluorescent substance used in the production.

The examples of method for synthesizing the crude polymeric fluorescent substance that has a vinylene group in the main chain are, for example, those mentioned in JP-A-5-202355. That is, they are polymerization by a Wittig reaction between a dialdehyde compound and a diphosphonium salt compound; polymerization by a Heck reaction between a divinyl compound and a dihalogen compound or between vinyl halogen compounds alone; polymerization by a Horner-Wadsworth-Emmons method between a dialdehyde compound and a diphosphite compound; polycondensation by a dehydrohalogenation method of a compound having two halogenated methyl groups; polycondensation by a sulfonium salt decomposition method of a compound having two sulfonium salt groups; polymerization by a Knoevenagel reaction between a dialdehyde compound and a diacetonitrile compound; and polymerization by a McMurry reaction of a dialdehyde compound.

The examples in the case where the main chain does not have a vinylene group include polymerization from the corresponding monomer by a Suzuki coupling reaction; polymerization by a Grignard reaction; polymerization with a Ni(0) catalyst; polymerization with an oxidant such as $FeCl_3$; electrochemical oxidation polymerization; or decomposition of an intermediate polymer having an appropriate leaving group.

When using the polymeric fluorescent substance of the present invention as a light emitting material for the polymer LED, a monomer of the crude polymeric fluorescent substance prior to polymerization is preferably polymerized after purification by distillation, sublimation, recrystallization or the like, because the purity influences the light emitting property.

Further, the crude polymeric fluorescent substance may contain other repeating units than the repeating unit represented by formula (1) unless the fluorescence property or charge transport property is damaged. Furthermore, the repeating unit represented by formula (1) and other repeating units may be linked at non-conjugated parts. The non-conjugated parts may be contained in the repeating units. Examples of bind structures that contain the above non-conjugated parts include those shown below, a combination of those shown below and a vinylene group, and a combination of two or more of those shown below. Here, R is a group selected from the same substituents as mentioned above, and Ar represent a hydrocarbon group having 6 to 60 carbon atoms.

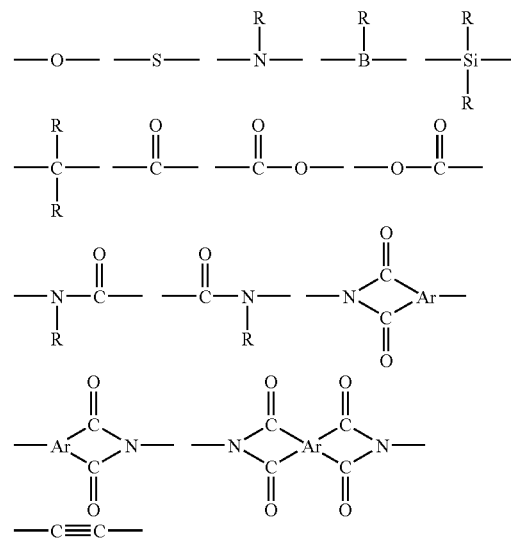

The crude polymeric fluorescent substance may be a random, block or graft copolymer, or a polymer having an intermediate structure of them such as a random copolymer having a structure similar to a block structure. From a viewpoint to obtain a polymeric fluorescent substance with a high quantum yield of fluorescence, a random copolymer having a structure similar to a block structure, a block copolymer or a graft copolymer is preferred to a completely random copolymer. Those that are branched at the main chain and has three or more terminals as well as a dendrimer are also included.

When using as a light emitting material for the polymer LED, light emission from a thin film is used. Therefore, the crude polymeric fluorescent substance that is fluorescent in a solid state is preferably used.

Examples of good solvents for the crude polymeric fluorescent substance include chloroform, methylene chloride, dichloroethane, tetrahydrofuran, toluene, xylene, mesitylene, decalin, n-butylbenzene and dioxane. The crude polymeric fluorescent substance can be dissolved in these solvents usually in an amount of 0.1 wt % or more, depending on the structure or molecular weight of the polymeric fluorescent substance.

Next, the polymer LED of the present invention will be described below.

The structure of the polymer LED of the present invention is characterized by having a light emitting layer between electrodes consisting of a pair of an anode and a cathode at least one of which is transparent or translucent, and in which the polymeric fluorescent substance obtained by the production method of the present invention is included in the light emitting layer.

Further, examples of the polymer LED of the present invention include a polymer LED having an electron transport layer between a cathode and a light emitting layer, a polymer LED having a hole transport layer between an anode and a light emitting layer, and a polymer LED having an electron transport layer between a cathode and a light emitting layer and having a hole transport layer between an anode and a light emitting layer.

For example, the specific examples include the following structures of a) to d):

a) anode/light emitting layer/cathode
b) anode/hole transport layer/light emitting layer/cathode
c) anode/light emitting layer/electron transport layer/cathode
d) anode/hole transport layer/light emitting layer/electron transport layer/cathode wherein "/" indicates that each of layers is laminated adjacent to one another; the same shall be applied hereinafter.

In the above, the light emitting layer is a layer having a function of emitting light; the hole transport layer is a layer having a function of transporting holes; and the electron transport layer is a layer having a function of transporting electrons. The electron transport layer and the hole transport layer are generically referred to as a charge transport layer. The light emitting layer, the hole transport layer and the electron transport layer may each independently comprise two or more layers.

In particular, among the charge transport layers provided adjacent to an electrode, a layer having a function of improving the efficiency of charge injection from an electrode and an effect to lower the drive voltage of an element or device is sometimes generally referred to as a charge injection layer (hole injection layer, electron injection layer).

Further, in order to improve cohesion to an electrode or charge injection from an electrode, the above charge injection layer or an insulating layer with a thickness of 2 nm or less may be provided adjacent to the electrode. Also in order to improve cohesion between interfaces or prevent admixture between the interfaces, a thin buffer layer may be inserted to an interface of charge transport layer(s) or a light emitting layer.

The order and the number of the layers to be laminated, and the thickness of each layer can be determined properly by taking into account the luminous efficiency and the life of a device.

In the present invention, examples of the polymer LED provided with a charge injection layer (electron injection layer, hole injection layer) include a polymer LED provided with a charge injection layer adjacent to a cathode and a polymer LED provided with a charge injection layer adjacent to an anode.

The specific examples include the following structures of e) to p):

e) anode/charge injection layer/light emitting layer/cathode
f) anode/light emitting layer/charge injection layer/cathode
g) anode/charge injection layer/light emitting layer/charge injection layer/cathode
h) anode/charge injection layer/hole transport layer/light emitting layer/cathode
i) anode/hole transport layer/light emitting layer/charge injection layer/cathode
j) anode/charge injection layer/hole transport layer/light emitting layer/charge injection layer/cathode
k) anode/charge injection layer/light emitting layer/electron transport layer/cathode
l) anode/light emitting layer/electron transport layer/charge injection layer/cathode
m) anode/charge injection layer/light emitting layer/electron transport layer/charge injection layer/cathode
n) anode/charge injection layer/hole transport layer/light emitting layer/electron transport layer/cathode
o) anode/hole transport layer/light emitting layer/electron transport layer/charge injection layer/cathode
p) anode/charge injection layer/hole transport layer/light emitting layer/electron transport layer/charge injection layer/cathode Specific examples of the charge injection layer include a layer containing a conducting polymer; a layer provided between an anode and a hole transport layer and containing a material with an ionization potential of an intermediate value between that of an anode material and that of a hole transport material contained in a hole transport layer; and a layer provided between a cathode and an electron transport layer and containing a material with an electron affinity of an intermediate value between that of a cathode material and that of an electron transport material contained in an electron transport layer.

When the above charge injection layer is a layer containing a conducting polymer, the electrical conductivity of the conducting polymer is preferably not less than $10^{-5}$ S/cm to not more than $10^3$ S/cm. In order to reduce the leak current between light emitting pixels, it is more preferably not less than $10^{-5}$ S/cm to not more than $10^2$ S/cm and further preferably not less than $10^{-5}$ S/cm to not more than $10^1$ S/cm.

In order to give the electrical conductivity of not less than $10^{-5}$ S/cm to not more than $10^3$ S/cm for the above conducting polymer, it is usually doped with an appropriate amount of ions.

The types of ions to be doped with are an anion for a hole injection layer and a cation for an electron injection layer. Examples of the anions include a polystyrene sulfonic acid ion, an alkyl benzene sulfonic acid ion and a camphor sulfonic acid ion. Examples of the cations include a lithium ion, a sodium ion, a potassium ion, and a tetrabutyl ammonium ion.

The thickness of the electron injection layer is, for example, 1 nm to 100 nm and preferably 2 nm to 50 nm.

The material to be used for the electron injection layer may be properly selected depending on the materials of an electrode or a layer adjacent thereto. The examples include: polyaniline and derivatives thereof; polythiophene and derivatives thereof; polypyrrole and derivatives thereof; polyphenylene vinylene and derivatives thereof; polythienylene vinylene and derivatives thereof; polyquinoline and derivatives thereof; polyquinoxaline and derivatives thereof; a conducting polymer such as a polymer containing an aromatic amine structure in the main chain or a side chain; metal phthalocyanine (such as copper phthalocyanine); and carbon.

The insulating layer with a thickness of 2 nm or less has a function of facilitating charge injection. Examples of the material for the above insulating layer include a metal fluoride, a metal oxide and an organic insulating material.

Examples of the polymer LED provided with the insulating layer with a thickness of 2 nm or less include a polymer LED provided with an insulating layer with a thickness of 2 nm or less adjacent to a cathode and a polymer LED provided with an insulating layer with a thickness of 2 nm or less adjacent to an anode.

The specific examples include the following structures of q) to ab):

q) anode/insulating layer with a thickness of 2 nm or less/light emitting layer/cathode r) anode/light emitting layer/insulating layer with a thickness of 2 nm or less/cathode s) anode/insulating layer with a thickness of 2 nm or less/light emitting layer/insulating layer with a thickness of 2 nm or less/cathode t) anode/insulating layer with a thickness of 2 nm or less/hole transport layer/light emitting layer/cathode u) anode/hole transport layer/light emitting layer/insulating layer with a thickness of 2 nm or less/cathode v) anode/insulating layer with a thickness of 2 nm or less/hole transport layer/light emitting layer/insulating layer with a thickness of 2 nm or less/cathode w) anode/insulating layer with a thickness of 2 nm or less/light emitting layer/electron transport layer/cathode x) anode/light emitting layer/electron transport layer/insulating layer with a thickness of 2 nm or less/cathode y) anode/insulating layer with a thickness of 2 nm or less/light emitting layer/electron transport layer/insulating layer with a thickness of 2 nm or less/cathode z) anode/insulating layer with a thickness of 2 nm or less/hole transport layer/light emitting layer/electron transport layer/cathode aa) anode/hole transport layer/light emitting layer/electron transport layer/insulating layer with a thickness of 2 nm or less/cathode ab) anode/insulating layer with a thickness of 2 nm or less/hole transport layer/light emitting layer/electron transport layer/insulating layer with a thickness of 2 nm or less/cathode It is very advantageous in producing the polymer LED to use those polymeric fluorescent substance soluble in organic solvents which are obtained by the production method of the present invention, because when forming a film from a solution, only drying and removing the solvent is needed after coating; and also when mixing a charge transport material and a light emitting material, the same technique can be applied. Examples of the methods for forming a film from a solution include coating methods such as a spin coating method, a casting method, a microgravure coating method, a gravure coating method, a bar coating method, a roll coating method, a wire bar coating method, a dip coating method, a spray coating method, a screen printing method, a flexoprinting method, an offset printing method and an ink jet printing method.

The optimum value of the thickness of the light emitting layer varies depending on a material used and may be selected so as to have optimum values of drive voltage and luminous efficiency. It is, for example, 1 nm to 1 μm, preferably 2 nm to 500 nm and more preferably 5 nm to 200 nm.

In the polymer LED of the present invention, a light emitting material other than the above polymeric fluorescent substance obtained in the production method of the present invention may be used in admixture in the light emitting material. Further, in the polymer LED of the present invention, a light emitting layer containing a light emitting material other than the above polymeric fluorescent substance may be laminated with a light emitting layer containing the above polymeric fluorescent substance.

The known light emitting materials can be used. As low molecular weight compounds, the examples that can be used include a naphthalene derivative; anthracene or derivatives thereof; perylene or derivatives thereof; a dye such as polymethine, xanthene, coumarin and cyanine; a metal complex of 8-hydroxyquinoline or derivatives thereof; an aromatic amine; tetraphenylcyclopentadiene or derivatives thereof; and tetraphenylbutadiene or derivatives thereof.

The specific examples that can be used include known ones such as those described in JP-A-57-51781 and JP-A-59-194393.

When the polymer LED of the present invention has a hole transport layer, examples of the hole transport material that is used include polyvinylcarbazole or derivatives thereof; polysilane or derivatives thereof; a polysiloxane derivative having an aromatic amine on a side chain or the main chain; a pyrazoline derivative; an arylamine derivative; a stilbene derivative; a triphenyldiamine derivative; polyaniline or derivatives thereof; polythiophene or derivatives thereof; polypyrrole or derivatives thereof; poly(p-phenylene vinylene) or derivatives thereof; and poly(2,5-thienylene vinylene) or derivatives thereof.

Specific examples of the hole transport material include those described in JP-A-63-70257, JP-A-63-175860, JP-A-2-135359, JP-A-2-135361, JP-A-2-209988, and JP-A-3-37992 and JP-A-3-152184.

Among them, the hole transport material for the hole transport layer is preferably a hole transport polymeric material such as polyvinylcarbazole or derivatives thereof; polysilane or derivatives thereof; a polysiloxane derivative having an aromatic amine compound group on a side chain or the main chain; polyaniline or derivatives thereof; polythiophene or derivatives thereof; poly(p-phenylene vinylene) or derivatives thereof; or poly(2,5-thienylene vinylene) or derivatives thereof, more preferably polyvinylcarbazole or derivatives thereof; polysilane or derivatives thereof; or a polysiloxane derivative having an aromatic amine on a side chain or the main chain. For a hole transport low-molecular-weight material, it is preferably used after dispersed in a polymer binder.

Polyvinylcarbazole or derivatives thereof can be obtained by cation polymerization or radial polymerization from, for example, a vinyl monomer.

Examples of polysilane or derivatives thereof include compounds described in Chem. Rev., vol. 89, p. 1359 (1989) and British Patent GB2300196. For a synthesizing method, those described in them can be also used, but a Kipping method is preferably used.

Polysiloxane or derivatives thereof having the structure of the above hole transport low-molecular-weight material on the side chain or the main chain is preferably used because the skeletal structure of siloxane hardly has a hole transport property. In particular, the example is the one having an aromatic amine with a hole transport property on a side chain or the main chain.

There is no limitation for film forming method of the hole transport layer, but for the hole transport low-molecular-weight material a film forming from a solution mixed with a polymer binder is used for example. For the hole transport polymer material, a film forming from a solution is used for example.

Any solvent that dissolves the hole transport material may be used as a solvent for film forming from a solution without any particular limitation. Examples of the solvent include a chlorine-containing solvent such as chloroform, methylene chloride, dichloroethane, etc., an ether solvent such as tetrahydrofuran, etc., an aromatic hydrocarbon solvent such as toluene, xylene, etc., a ketone solvent such as acetone, methyl ethyl ketone, etc., an ester solvent such as ethyl acetate, butyl acetate, ethyl celosolve acetate, etc.

For the film forming from a solution, an application method from a solution can be used, such as a spin coating method, a casting method, a microgravure coating method, a gravure coating method, a bar coating method, a roll coating method, a wire bar coating method, a dip coating method, a spray coating method, a screen printing method, a flexoprinting method, an offset printing method, and an ink jet printing method.

For the polymer binder to be mixed, preferably used is those that do not extremely inhibit a charge transport and also those that do not strongly absorb visible rays. Examples of the polymer binder include polycarbonate, polyacrylate, polymethylacrylate, polymethylmethacrylate, polystyrene, polyvinyl chloride and polysiloxane.

The optimum value of thickness of the hole transport layer varies depending on a material to be used, but may be selected so that the drive voltage and the luminous efficiency have appropriate values. However, it needs at least a thickness that does not occur a pinhole, but too a thick film increases the drive voltage of the device, which is not preferable. Therefore, the thickness of the hole transport layer is, for example, 1 nm to 1 µm, preferably 2 nm to 500 nm, and more preferably 5 nm to 200 nm.

When the polymer LED of the present invention has an electron transport layer, the known material can be used as an electron transport material. The examples include an oxadiazole derivative; anthraquinodimethane or derivatives thereof; benzoquinone or derivatives thereof; naphthoquinone or derivatives thereof; anthraquinone or derivatives thereof; tetracyanoanthraquinonedimethane or derivatives thereof; a fluorenone derivative; diphenyldicyanoethylene or derivatives thereof; a diphenoquinone derivative; 8-hydroxyquinoline or a metal complex with a derivative thereof; polyquinoline or derivatives thereof; polyquinoxaline or derivatives thereof; polyfluorene or derivatives thereof.

The specific examples include those described in JP-A-63-70257, JP-A-63-175860, JP-A-2-135359, JP-A-2-135361, JP-A-2-209988, JP-A-3-37992, and JP-A-3-152184.

Among them, preferred are an oxadiazole derivative; benzoquinone or derivatives thereof; anthraquinone or derivatives thereof; 8-hydroxyquinoline or a metal complex with a derivative thereof; polyquinoline or derivatives thereof; polyquinoxaline or derivatives thereof; and polyfluorene or derivatives thereof, and more preferred are 2-(4-biphenylyl)-5-(4-t-butylphenyl)-1,3,4-oxadiazole, benzoquinone, anthraquinone, tris(8-quinolinol)aluminum and polyquinoline.

There is no special limitation to method for forming an electron transport layer. However, for an electron transport low-molecular-weight material, vacuum deposition from a powder or a film forming from a solution or a melt state is used for example. For an electron transport polymer material, a film forming from a solution or a melt state is used for example. When forming a film from a solution or a melt state, a polymer binder may be used together.

Any solvents that can dissolve an electron transport material and/or a polymer binder can be used in forming a film from a solution without special limitation. Examples of the solvents include a chlorine-containing solvent such as chloroform, methylene chloride, dichloroethane; an ether solvent such as tetrahydrofuran; an aromatic hydrocarbon solvent such as toluene, xylene; a ketone solvent such as acetone, methyl ethyl ketone; an ester solvent such as ethyl acetate, butyl acetate, ethyl celosolve acetate.

Examples of method for forming a film from a solution or a melt state include application methods such as a spin coating method, a casting method, a microgravure coating method, a gravure coating method, a bar coating method, a roll coating method, a wire bar coating method, a dip coating method, a spray coating method, a screen printing method, a flexoprinting method, an offset printing method, and an ink jet printing method.

For the polymer binder to be mixed, preferably used is those that do not extremely inhibit charge transport and also those that do not strongly absorb visible rays. Examples of the polymer binders include poly(N-vinylcarbazole); polyaniline or derivatives thereof; polythiophene or derivatives thereof; poly(p-phenylene vinylene) or derivatives thereof; poly(2,5-thienylene vinylene) or derivatives thereof; polycarbonate; polyacrylate; polymethylacrylate; polymethylmethacrylate; polystyrene; polyvinyl chloride; and polysiloxane.

The optimum value of thickness of an electron transport layer varies depending on a material used and may be selected so that the drive voltage and the luminous efficiency have appropriate values. However, it needs at least a thickness that does not occur a pinhole, but too a thick film increases the drive voltage of the device, which is not preferable. Therefore, the thickness of the electron transport layer is, for example, 1 nm to 1 µm, preferably 2 nm to 500 nm, and more preferably 5 nm to 200 nm.

Any substrates that does not change when forming electrodes and forming an organic layer(s) can form the polymer LED of the present invention. The examples include glass, plastics, a polymer film and a silicon substrate. For an opaque substrate, the opposite electrode is preferably transparent or translucent.

In the present invention, the anode side is preferably transparent or translucent. However, the material for the anode is a conductive metal oxide film, a translucent metal thin film or the like. The specific examples include indium oxide; zinc oxide; tin oxide; a complex of them, namely indium/tin/oxide (ITO); a film formed by use of conductive glass comprising indium/zinc/oxide and the like (NESA and the like); gold; platinum; silver; copper; and the like. ITO, indium/zinc/oxide and tin oxide are preferred. Examples of the production methods include a vacuum deposition method, a sputtering method, an ion plating method and a plating method. The anode may be an organic transparent conductive film of polyaniline or derivatives thereof, polythiophene or derivatives thereof or the like.

The thickness of the anode can be appropriately selected taking into account light permeability and electrical conductivity, and is, for example, 10 nm to 10 µm, preferably 20 nm to 1 µm, and more preferably 50 nm to 500 nm.

Further, in order to facilitate charge injection, a layer comprising a phthalocyanine derivative, a conducting polymer, carbon or the like or a layer with an average thickness of 2 nm or less comprising a metal oxide, a metal fluoride, an organic insulating material or the like may be provided on an anode.

The material of the cathode used for the polymer LED of the present invention is preferably a material with a low work function. The examples include a metal such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium; an alloy of two or more of them; an alloy of one or more of them and one or more of gold, silver, platinum, copper, manganese, titanium, cobalt, nickel, tungsten and tin; graphite or a graphite intercalation compound. Examples of the alloys include a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy. The cathode may have a laminated structure of two or more layers.

The thickness of the cathode can be appropriately selected taking into account electrical conductivity and durability, and is, for example, 10 nm to 10 μm, preferably 20 nm to 1 μm, and more preferably 50 nm to 500 nm.

A method for producing the cathode is a vacuum deposition method, a sputtering method or a laminating method comprising heat press deposition of a metal thin film. Further, a layer comprising a conducting polymer or a layer with an average thickness of 2 nm or less comprising a metal oxide, a metal fluoride, an organic insulating material or the like may be provided between a cathode and an organic layer. After making a cathode, a protection layer to protect the polymer LED may be attached. In order to stably use the polymer LED for a long time, it is preferable to attach a protection layer and/or a protection cover for protecting the device from the outside.

For the protection layer, a polymer compound, a metal oxide, a metal fluoride, a metal boride or the like may be used. Further, the protection cover may be a glass plate or a plastic plate having its surface subjected to a low water permeability treatment. The cover is preferably used to be attached to and seal a device substrate with a thermosetting resin or light curing resin. The device can be easily prevented from being damaged by keeping clearance by use of a spacer. Oxidation of the cathode can be prevented by charging the clearance with an inert gas such as nitrogen or argon. Moreover, provision of a desiccant such as barium oxide in the clearance can make it easy to prevent the moisture adsorbed in the production step from damaging the device. Any one or more of the measures described above may be preferably taken.

To obtain two-dimensional light emission using the polymer LED of the present invention, sheet-shaped anode and cathode may be arranged to overlap to each other. Moreover, examples of method for obtaining patterned light emission include a method of arranging a mask provided with patterned windows on the surface of the above sheet-shaped light emitting device; a method of making an organic layer of a non-light emitting part extremely thick, thereby making itself substantially not light emissible; and a method of forming either an anode or a cathode or both of them in a patterned manner. A segment type display device that can display numerals, letters, simple symbols and the like can be obtained by forming patterns by any of these methods and arranging some electrodes so that they can be independently turned ON/OFF. Further, a dot matrix device can be obtained by forming both an anode and a cathode in stripes and arranging them orthogonally. A partial color display and a multicolor display can be obtained by partially arranging plural kinds of polymeric fluorescent substances that emit light in different colors or by using a color filter or a fluorescence conversion filter. The dot matrix device can be driven by a passive drive or active drive in combination with TFT and the like. These display devices can be used as a display device such as a computer, a television, a mobile terminal, a mobile phone, a car navigator and a viewfinder of a video camera.

Moreover, the above sheet-shaped light emitting device is of a self-emission thin film type and can be preferably used as a sheet-shaped light source for a backlight of a liquid crystal display device or as a sheet-shaped light source for illumination. When using a flexible substrate, it can also be used as a curved light source or display device.

The present invention will be described in further detail below with reference to Examples but the present invention should not be limited thereto.

The number average molecular weight in this specification is a polystyrene equivalent number average molecular weight obtained by gel permeation chromatography (GPC) using chloroform as a solvent.

EXAMPLE 1

<Synthesis of Polymeric Fluorescent Substance 1>

After dissolving 0.166 g of 2-methoxy-5-(2-ethylhexyloxy)-p-xylene dichloride and 9.77 g of 4-(3,7-dimethyloctyloxy)phenyl-p-xylylene dichloride in 1,850 g of dry 1,4-dioxane, followed by bubbling with nitrogen for 15 minutes and then degassing, the solution was heated to 95° C. To the solution, a solution of 7.4 g of t-butoxy potassium/100 g of dry 1,4-dioxane was added dropwise over 5 minutes. After further heating the resulting solution to 97° C., a solution of 5.6 g of t-butoxy potassium/100 g of dry 1,4-dioxane was added dropwise to that resulting solution. The mixture was allowed to react at 97 to 98° C. for 2 hours. After the reaction, the mixture was cooled to 50° C. and neutralized by adding a mixed solution of 7.0 g of acetic acid/7.0 g of 1,4-dioxane. After being allowed to stand to room temperature, the reaction solution was poured into methanol with stirring. Then, the deposited precipitate was separated by filtration and the step of washing with methanol was repeated twice. The obtained precipitate was dried under a reduced pressure at 50° C. for 8 hours to obtain a polymer.

Next, the polymer was dissolved in tetrahydrofuran, which was poured into methanol followed by reprecipitation/purification. After washing with methanol, the precipitate was dried under a reduced pressure at 50° C. for 8 hours to obtain 4.41 g of a polymer.

<Alkali Treatment>

After 0.93 g of the polymer was dissolved in 320 g of dry 1,4-dioxane followed by bubbling with nitrogen for 15 minutes and then degassing, the solution was heated to 90° C. To the solution, a solution of 1.3 g of t-butoxy-potassium/ 20 g of dry 1,4-dioxane was added dropwise over 5 minutes. The resulting solution was further heated to 93° C. and stirred for 9 hours.

Then, the resulting solution was cooled to 50° C. and neutralized by adding a mixed solution of 1.1 g of acetic acid/1.1 g of 1,4-dioxane. After being allowed to stand to room temperature, the reaction solution was poured into ion-exchanged water with stirring. Then, the deposited precipitate was separated by filtration and washed with methanol. The obtained precipitate was dried under a reduced pressure at 50° C. for 4 hours to obtain 0.88 g of a polymer.

Further, the polymer was dissolved in tetrahydrofuran and poured into methanol followed by reprecipitation/purification. After washing with methanol, the precipitate was dried under a reduced pressure at 50° C. for 5.5 hours to obtain 0.85 g of a polymer. The polymer is referred to as polymeric fluorescent substance 1.

The polystyrene equivalent number average molecular weight of the polymeric fluorescent substance 1 was $1.6 \times 10^5$. A 0.4% solution of polymeric fluorescent substance 1 in toluene was heated to become a homogeneous solution and it did not gel even when returned to room temperature.

COMPARATIVE EXAMPLE 1

The crude polymeric fluorescent substance before alkali treatment in Example 1 is referred to as polymeric fluorescent substance 2. The polystyrene equivalent number average molecular weight of the polymeric fluorescent substance 2 was $4.3 \times 10^5$. A 0.4% solution of polymeric fluorescent substance 2 in toluene was heated to become a homogeneous solution but it gelled when returned to room temperature.

EXAMPLE 2

<Production and evaluation of element>

A film with a thickness of 50 nm was formed by spin coating of a solution of poly(ethylenedioxythiophene)/polystyrene sulfonic acid (from Bayer AG, Baytron) onto a glass substrate with an ITO film of a thickness of 150 nm formed thereon by a sputtering method, followed by being dried on a hotplate at 120° C. for 5 minutes. Then, a film with a thickness of 100 nm was formed by spin coating of a 0.4 wt % solution of polymeric fluorescent substance 1 in chloroform. After drying this film at 80° C. under a reduced pressure for 1 hour, a polymer LED was produced by depositing 0.4 nm of lithium fluoride as a cathode buffer layer, and 25 nm of calcium and then 40 nm of aluminum as a cathode. The degree of vacuum during the deposition were continuously 1 to $8 \times 10^{-6}$ Torr. EL emission from the polymeric fluorescent substance 1 was obtained by applying a voltage to the resultant device. The voltage when light emission started was about 3 V and the maximum luminous efficiency was about 6.8 cd/A.

EXAMPLE 3

5<Synthesis of Polymeric Fluorescent Substance 3>

9,9-Dioctylfluorene-2,17-bis(ethylene boronate)(900 mg, 1.641 mmol), 2,7-dibromo-9,9-dioctylfluorene (914 mg, 1.723 mmol) and aliquat336 (660 mg) were dissolved in toluene (30 ml) in an inert atmosphere, to which an aqueous solution (30 ml) of potassium carbonate (680 mg, 4.923 mmol) and then tetrakis(triphenylphosphine)palladium (57 mg, 0.0492 mmol) were added, followed by heating under reflux for 20 hours. After allowed to stand to room temperature, the layers of the solution were separated and the organic layer was washed with water. The organic layer was added dropwise to methanol (300 ml), and the deposited precipitate was separated by filtration. The precipitate was purified by silica gel chromatography (toluene) to obtain a polymer. The yield was 863 mg. The polystyrene equivalent number average molecular weight of the polymer was $1.3 \times 10^4$.

<Alkali Treatment>

Then, 50 mg of the resultant polymer was dissolved in toluene to obtain 4 g of a solution. The solution and 2 ml of 25% ammonia water were mixed in a sealed vessel, stirred at room temperature for 3 hours, and allowed to stand still to separate toluene and water. Then, the layers of the solution was separated to collect a toluene part. The solution was added to 100 ml of methanol and stirred, and the resultant precipitate was separated by filtration. The precipitate was washed with methanol and dried at 50° C. under a reduced pressure for 2 hours to obtain 38 mg of a polymer.

The polymer is referred to as polymeric fluorescent substance 3. The polymeric fluorescent substance 3 was soluble in a solvent such as toluene and chloroform.

<Solubility>

When a 1.5% solution of polymeric fluorescent substance 3 in toluene was stored in a refrigerator (about 10° C.) overnight, the solution became a soft gel. However, when returning to room temperature, it became a homogeneous solution immediately.

<Fluorescence Property>

A thin film of the polymeric fluorescent substance 3 was produced by spin coating of a 0.4 wt % solution of polymeric fluorescent substance 3 in chloroform onto a quartz plate. The ultraviolet visible absorption spectrum and the fluorescence spectrum of the thin film were measured by use of an ultraviolet visible absorption spectrometer (Hitachi, Ltd. UV3500) and a fluorescence spectrometer (Hitachi, Ltd. 850). A fluorescence spectrum obtained when excited at 350 nm was used to determine the fluorescence intensity. The area of the fluorescence spectrum plotted by taking the wave number on the abscissa was divided by the absorbance at 350 nm to obtain the relative value of the fluorescence intensity.

The fluorescence peak wavelength of the polymeric fluorescent substance 3 was 428 nm, and the relative value of the fluorescence intensity was 3.1.

COMPARATIVE EXAMPLE 2

The crude polymeric fluorescent substance before alkali treatment in Example 3 is referred to as polymeric fluorescent substance 4. The ultraviolet visible absorption spectrum and the fluorescence spectrum were measured by use of the polymeric fluorescent substance 4 in the same manner as in Example 3 to obtain the relative value of the fluorescence intensity.

The fluorescence peak wavelength of the polymeric fluorescent substance 4 was 426 nm, and the relative value of the fluorescence intensity was 0.26.

Further, when a 1.5% solution of polymeric fluorescent substance 4 in toluene was stored in a refrigerator (about 10° C.) overnight, the solution became a gel, and even when returned to room temperature, it did not become a homogeneous solution immediately.

INDUSTRIAL APPLICABILITY

The polymeric fluorescent substance obtained by the production method of the present invention is excellent in solubility in an organic solvent and can be preferably used as a dye for a polymer LED or a laser. Also, the polymer LED using the polymeric fluorescent substance obtained by the present production method shows a low voltage and a high luminous efficiency. Therefore, the polymer LED can be preferably used in a device such as a curved light source or sheet-shaped light source as a backlight, segment type display device, or dot matrix flat panel display.

The invention claimed is:

1. A method for producing a polymeric fluorescent substance characterized by comprising the steps of contacting with an alkali a crude polymeric fluorescent substance by dissolving the substance in an organic solvent with the alkali to prepare a solution of said substance, sealing said solution in an inert atmosphere and shielding said solution from light having wavelengths absorbable by the solution, wherein said crude polymeric fluorescent substance is fluorescent in a solid state and has a polystyrene equivalent number average molecular weight of $10^4$ to $10^8$ and one or more repeating units represented by the following formula (1):

$$-Ar_1-(CR_1=CR_2)_n- \quad (1)$$

wherein $Ar_1$ is an arylene group or heterocyclic compound group that is unsubstituted or substituted by one or more substituents; $R_1$ and $R_2$ each independently represent a group selected from the group consisting of a hydrogen atom, an alkyl group, an aryl group, a heterocyclic compound group and a cyano group, in which the aryl group and the heterocyclic compound group is optionally substituted by another substituent; and n is 0 or 1.

2. The method according to claim 1, wherein the alkali is a metal alkoxide, ammonia or amine.

3. The method according to claim 1 or 2, wherein the temperature to contact the crude polymeric fluorescent substance with the alkali is 10° C. to 200° C.

4. A polymeric fluorescent substance obtainable by the method according to claim 3.

5. A polymer light emitting device having at least a light emitting layer between electrodes consisting of a pair of an anode and a cathode at least one of which is transparent or translucent, characterized in that the light emitting layer contains the polymeric fluorescent substance according to claim 4.

6. The polymer light emitting device according to claim 5, wherein a layer comprising an electron transport compound is provided adjacent to the light emitting layer between the cathode and the light emitting layer.

7. The polymer light emitting device according to claim 5, wherein a layer comprising a hole transport compound is provided adjacent to the light emitting layer between the anode and the light emitting layer.

8. The polymer light emitting device according to claim 5, wherein a layer comprising an electron transport compound is provided adjacent to the light emitting layer between the cathode and the light emitting layer and a layer comprising a hole transport compound is provided adjacent to the light emitting layer between the anode and the light emitting layer.

9. A polymeric fluorescent substance obtainable by the method according to any one of claim 1 or 2.

10. A polymer light emitting device having at least a light emitting layer between electrodes consisting of a pair of an anode and a cathode at least one of which is transparent or translucent, characterized in that the light emitting layer contains the polymeric fluorescent substance according to claim 9.

11. The polymer light emitting device according to claim 10, wherein a layer comprising an electron transport compound is provided adjacent to the light emitting layer between the cathode and the light emitting layer.

12. The polymer light emitting device according to claim 10, wherein a layer comprising a hole transport compound is provided adjacent to the light emitting layer between the anode and the light emitting layer.

13. The polymer light emitting device according to claim 10, wherein a layer comprising an electron transport compound is provided adjacent to the light emitting layer between the cathode and the light emitting layer and a layer comprising a hole transport compound is provided adjacent to the light emitting layer between the anode and the light emitting layer.

14. A sheet-shaped light source characterized by using the polymer light emitting device according to claim 10.

15. A segment display device characterized by using the polymer light emitting device according to claims 10.

16. A dot matrix display device characterized by using the polymer light emitting device according to claim 10.

17. A liquid crystal display device characterized in that a backlight is the polymer light emitting device according to claim 10.

* * * * *